United States Patent [19]
Williams

[11] Patent Number: 5,616,945
[45] Date of Patent: Apr. 1, 1997

[54] MULTIPLE GATED MOSFET FOR USE IN DC-DC CONVERTER

[75] Inventor: Richard K. Williams, Cupertino, Calif.

[73] Assignee: Siliconix Incorporated, Santa Clara, Calif.

[21] Appl. No.: 542,611

[22] Filed: Oct. 13, 1995

[51] Int. Cl.$^6$ .......................... H01L 27/108; H01L 29/76
[52] U.S. Cl. .......................... 257/365; 257/296; 257/366
[58] Field of Search .................................. 257/133, 153, 257/167, 172, 327, 335, 365, 366, 296

[56] References Cited

U.S. PATENT DOCUMENTS

| | | | |
|---|---|---|---|
| 3,660,697 | 5/1972 | Berglund et al. | 257/215 |
| 4,445,202 | 4/1984 | Goetze et al. | 257/366 |

OTHER PUBLICATIONS

R.K. Williams et al., "Optimization of Complementary Power DMOSFETs for Low–Voltage High–Frequency DC–DC Conversion", IEEE Advan. Power Elec. Conference, May 1995, pp. 765–772.

R.K. Williams et al., "High–Frequency DC/DC Converter for Lithium–Ion Battery Applications Utilizes Ultra–Fast CBiC/D Process Technology", IEEE 1995, pp. 322–332.

Primary Examiner—Sara W. Crane
Assistant Examiner—Valencia Martin Wallace
Attorney, Agent, or Firm—Skjerven, Morrill, MacPherson, Franklin & Friel; David E. Steuber

[57] ABSTRACT

A power MOSFET includes a pair of electrically isolated gates having different gate widths. The MOSFET is connected in a switching mode DC—DC converter, with the gates being driven by a pulse width modulation (PWM) control to vary the duty cycle of the gate drive signal and thereby regulate the output voltage of the DC—DC converter. In light load conditions, the larger gate is disconnected from the PWM control to reduce the gate capacitance which must be driven by the PWM control. In normal load conditions, the larger gate is connected to the PWM control to reduce the on-resistance of the MOSFET. Both of these operations increase the efficiency of the DC—DC converter.

1 Claim, 17 Drawing Sheets

MULTIPLE GATED MOSFET FOR USE IN DC-DC CONVERTER

FIELD OF THE INVENTION

This invention relates to DC—DC converters and in particular to a multiple gated MOSFET that is well suited for use in DC—DC converters.

BACKGROUND OF THE INVENTION

DC—DC converters are used to convert an input DC voltage to an output DC voltage. In one class of DC—DC converters, known as switching mode converters, the output voltage is determined by the duty cycle of a switch to which the input voltage is applied.

An example of a switching mode DC—DC converter is the complementary synchronous buck converter 10 shown in FIG. 1. A complementary pair of MOSFETs M1 and M2 are connected in series between the input voltage $V_{in}$ and ground, P-channel MOSFET M1 serving as a series switch and N-channel MOSFET M2 serving as a shunt switch. The common node between MOSFETs M1 and M2 is connected through a low-pass filter including an inductor L1 and a capacitor C1 which deliver the output voltage $V_{out}$ to the load. $V_{out}$ is fed back to a pulse width modulation (PWM) control 12, which supplies a PWM signal to the gates of MOSFETs M1 and M2. $V_{out}$ is determined by the duty cycle of the PWM signal, i.e., in this case the percentage of the time during each cycle that the PWM signal is low, thereby turning P-channel MOSFET M1 on. PWM control 12 is controlled by the feedback path to maintain $V_{out}$ at a desired level.

DC—DC converters are available in a wide variety of topologies. FIG. 2 shows a totem pole N-channel synchronous buck converter 20, in which $V_{out}$ is determined by the duty cycle of high segment of the PWM signal applied to the gate of N-channel MOSFET M3. PWM control 22 supplies time delayed signals to the respective gates of MOSFETs M3 and M4 so as to prevent current "shoot through" from $V_{in}$ to ground. FIG. 3 shows a boost converter 30 which includes an N-channel MOSFET M5 and a Schottky diode 32.

A common feature of the converters shown in FIGS. 1–3, as well as numerous other converter topologies, is that one or more power MOSFET switches are used to control the transfer of energy from an energy source, here represented by $V_{in}$, into at least two reactive energy storage elements, namely an inductor and a capacitor. These energy storage elements then retransfer the stored energy, when required, into the load. By monitoring $V_{out}$ and by either controlling the pulse width of the signal which controls the MOSFET switches (assuming that the converter is operating at a fixed frequency), or adjusting the switching frequency (while holding the on-time of the switches constant), a constant $V_{out}$ can be maintained, despite changes in $V_{in}$ or the current demands of the load.

Of the various switching mode converter topologies and control schemes, fixed frequency converters provide a predictable noise spectrum. A predictable noise spectrum is particularly advantageous in communication products, such as cellular phones, since shifting noise spectra can interfere with information transfer in the broadcast band. With a fixed clock period, the energy transfer is a function of the switch on-time (or pulse width), which is modulated to compensate for an energy drain or a voltage build-up at the output of the converter.

Most converters, in their essential configuration, include a PWM control circuit, an inductor, a capacitor, and two MOSFET switches (or one MOSFET switch and a Schottky diode). Ideally, every element transfers power without loss. In reality, of course, some power is lost in every element. The IC control circuit, for example, draws power to operate internal amplifier, voltage reference, comparator, and clock circuits. The inductor loses power to the resistance of its coil and to the material used as its magnetic core. Even the capacitor has a series resistance component which absorbs energy.

In practice, however, most of the power in a converter is lost in the power MOSFET that is used as the series switch and in the power MOSFET or Schottky diode that is used as the shunt switch or rectifier. These losses can be divided into four categories:

1. Conduction losses which arise from the MOSFETs' internal resistance, represented as $I^2R \cdot D$, where I is the current through the switch, R is the on-resistance of the switch, and D is the percentage of the time that the switch is on.

2. Gate drive losses, or the power lost charging and discharging the MOSFETs' gate capacitance, represented as $Q_g \cdot V_{gs} \cdot f$, where $Q_g$ is the charge which accumulates on the gate, $V_{gs}$ is the gate-to-source voltage, and f is the frequency at which the switch is opened and closed.

3. Output capacitive losses, or the power lost charging and discharging the drain capacitance of the MOSFET switch, represented as $C_o \cdot V_{ds} \cdot f$.

4. Crossover losses, or losses which occur during the switching transitions of the MOSFETs, as a result of the simultaneous presence of a current through and a voltage across a MOSFET, represented as $I_{on} \cdot V_{ds} \cdot \partial t$, where $I_{on}$ is the current through the MOSFET during the switching transition and $\partial t$ is the duration of the switching transition.

The conduction losses are strongly dependent on the current and on-resistance while the gate drive and output capacitive losses are strongly dependent on the switching frequency. At low frequencies, particularly below 100 kHz, only the conduction losses need to be considered when calculating the efficiency of the converter. At higher frequencies, particularly frequencies approaching 1 MHz, the capacitive losses become significant. $V_{in}$ and $V_{out}$ affect all of the energy loss terms. In high voltage converters the output capacitance term can be dominant. In low voltage applications such as computers and battery powered circuits, however, particularly those in which $V_{in}$ is less than 8 volts, the output capacitance term is negligible. The two dominant terms are then the gate drive and conduction losses, and the power loss can be approximated by the following equation.

$$P_{loss} = Q_g(V_{gs}) \cdot V_{gs} \cdot f + I^2 \cdot R_{ds}(V_{gs}) \cdot (t_{on}(V_{in})/T)$$

An increase in the gate drive $V_{gs}$ reduces $R_{ds}$ and conduction losses but increases gate drive capacitance losses. The frequency f and the load current I are weighting factors which determine which term is dominant. At higher frequencies, the gate drive capacitance loss becomes significant for all light load conditions.

There is therefore a need for a MOSFET which provides low gate capacitive losses during light load conditions while providing low conduction losses during normal load conditions, without relying on frequency shifting or burst mode techniques.

SUMMARY OF THE INVENTION

The MOSFET of this invention includes a single source terminal, a single drain terminal and multiple gates, each of the gates being electrically isolated from the other gate or gates and having a gate width that is different from the other gate or gates. The preferred embodiment has dual gates, the larger of which has a gate width which is a multiple N times the gate width of the smaller gate. The factor N may commonly range from 5 to 500.

The MOSFET is preferably incorporated as a switch in a switching mode DC—DC converter. During the full power or normal running mode, a PWM signal is delivered to both gates, switching the MOSFET on and off. In this situation, the conduction losses of the converter are regulated by the total gate width of the MOSFET, which includes both gates, the larger gate carrying the major share of the current. When a light load condition is encountered, the larger gate is grounded, and the PWM signal is supplied only to the smaller gate. Therefore, during a light load condition energy is not lost driving the capacitance of the larger gate.

In the preferred embodiment the output from a PWM controller is split into two paths leading to the large and small gates, respectively. The path leading to the large gate is ANDed with an enable signal. If the enable signal is brought high, both the large and the small gates are driven simultaneously by the PWM controller. If the enable signal is pulled low, the PWM signal to the large gate is cut off, and only the small gate is active.

The large gate can be activated or deactivated within a single cycle of the PWM signal, making the response time of the MOSFET essentially instantaneous. This is in sharp contrast to the inherent delays in systems which rely on frequency shifting to control the power losses.

The larger and smaller gates may be constructed in numerous ways. In a MOSFET containing a plurality of identical cells, a smaller number of cells may be allocated to the smaller gate, thereby reducing the total gate "width", i.e., the combined perimeters of the cells. A larger number of cells are allocated to the large gate. Alternatively, the gate width may be varied by changing the cell density in certain areas of the device, with a lower cell density being used to reduce the total gate width of the small gate.

The preferred embodiments are constructed in the form of vertical current flow MOSFETs which share common source and drain terminals. However, the multiple gate structure is applicable to MOSFETs that are vertical, lateral or quasi-lateral, with or without field oxide steps in the drain, trench gated or non-trench gated, P-channel or N-channel, double diffused or conventional, and formed in an epitaxial layer or in a diffused well.

DESCRIPTION OF THE INVENTION

The preferred embodiment of this invention is a dual-gated power MOSFET in which the two gates are electrically isolated from each other and have substantially different gate widths. The MOSFET has a single drain and a single source.

Figure 1:
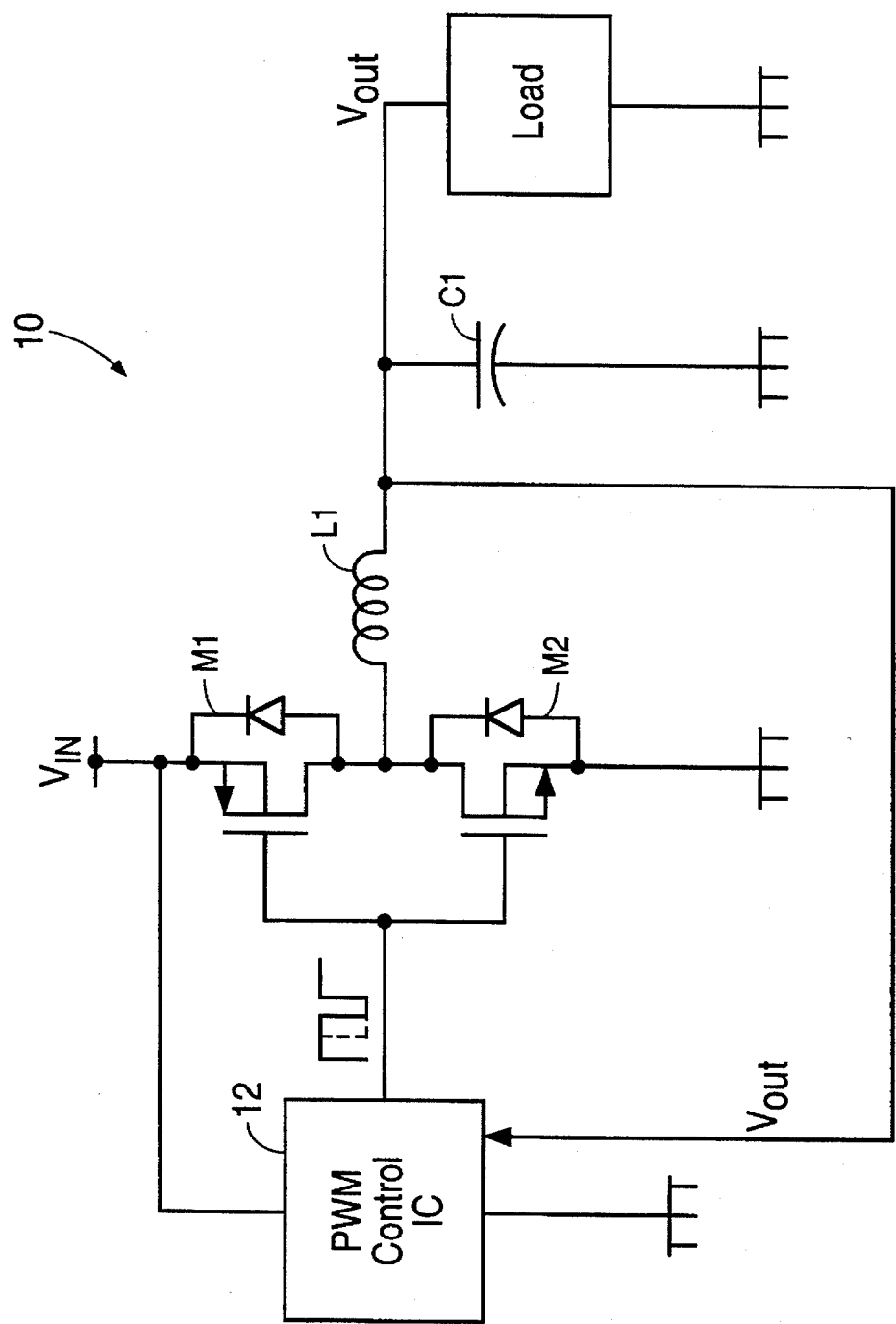
FIG. 1 is a circuit diagram of a conventional complementary synchronous buck converter.
Figure 2:
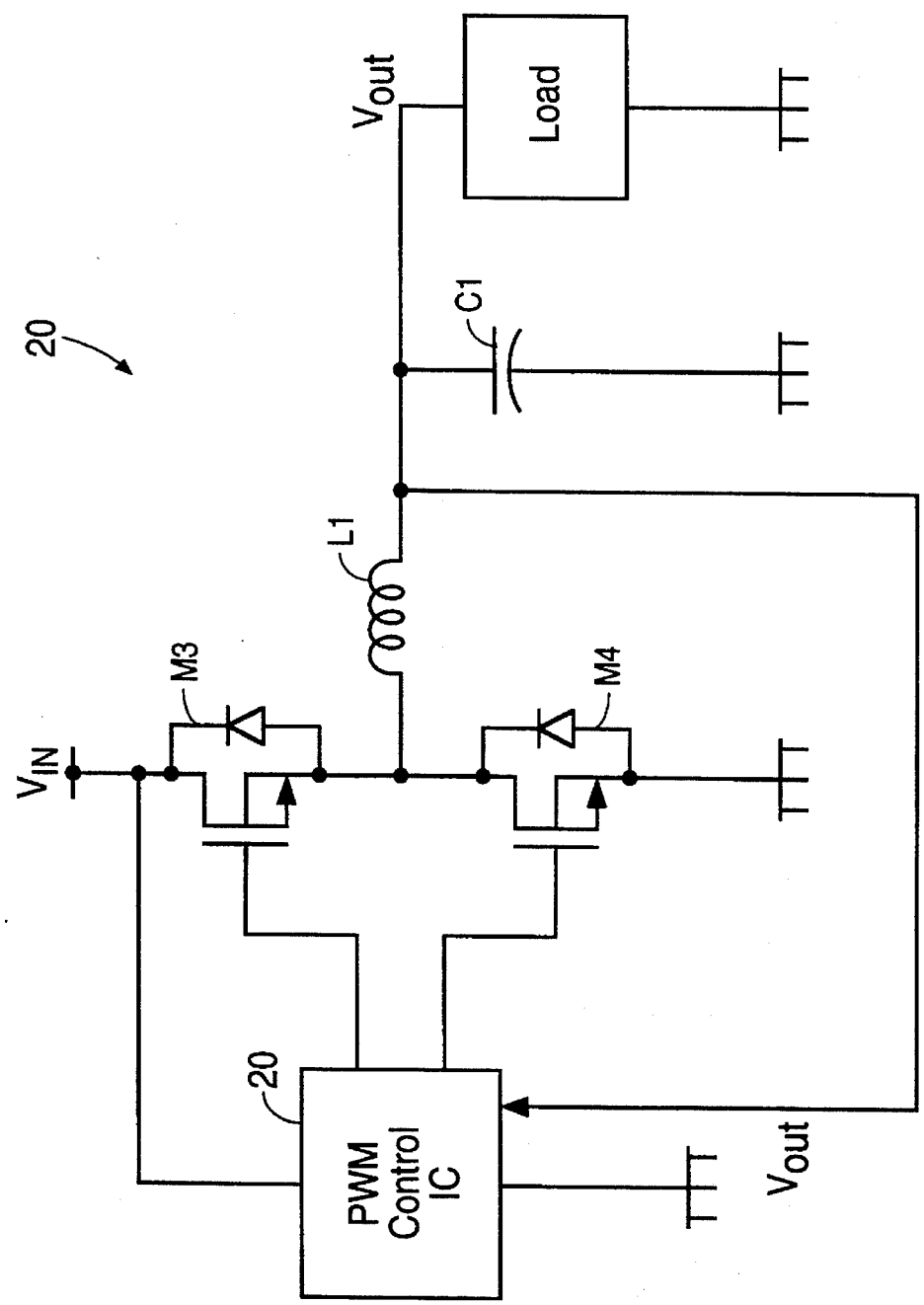
FIG. 2 is a circuit diagram of a conventional totem pole N-channel synchronous buck converter.
Figure 3:
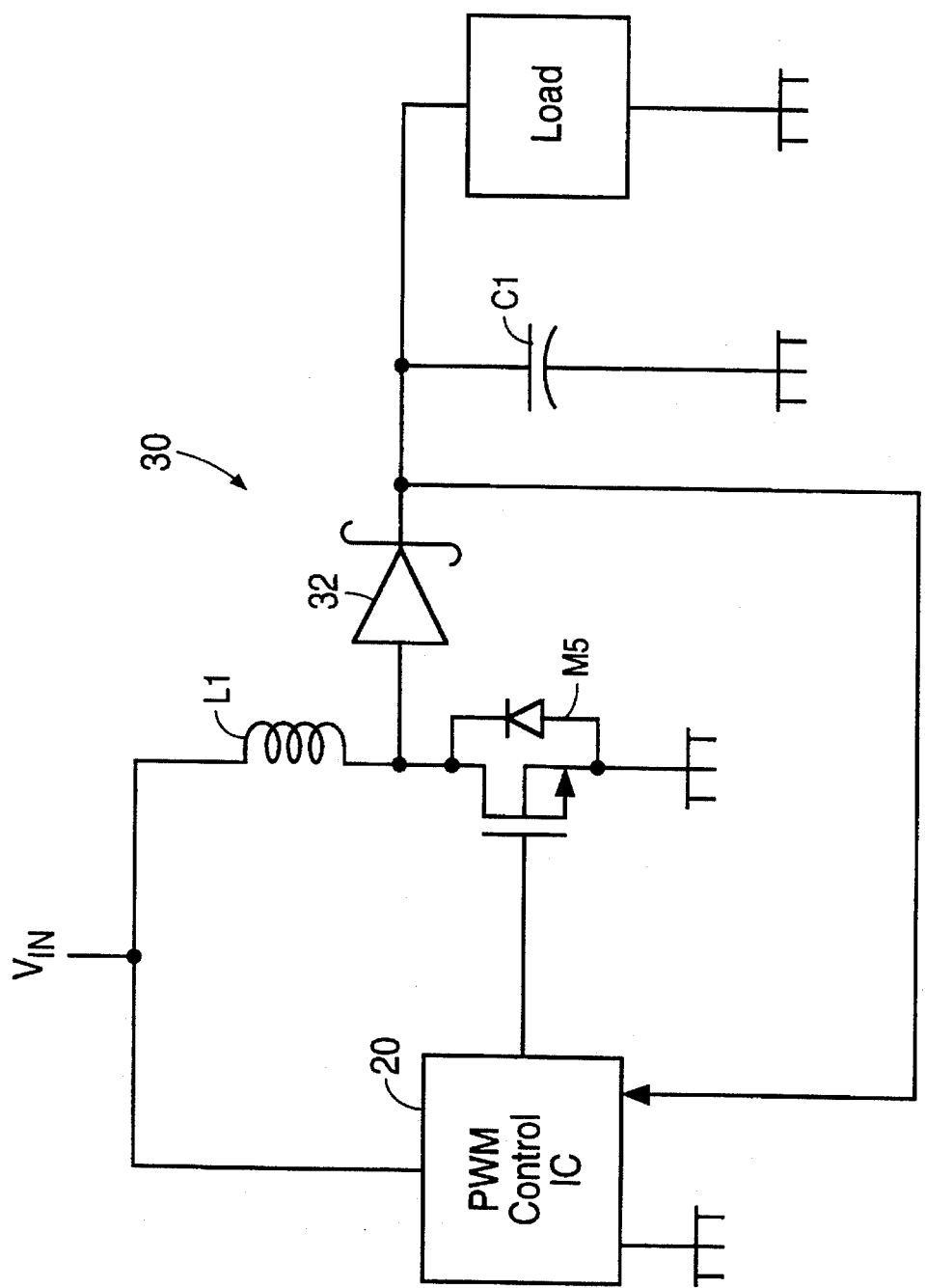
FIG. 3 is a circuit diagram of a conventional boost converter.
Figure 4:
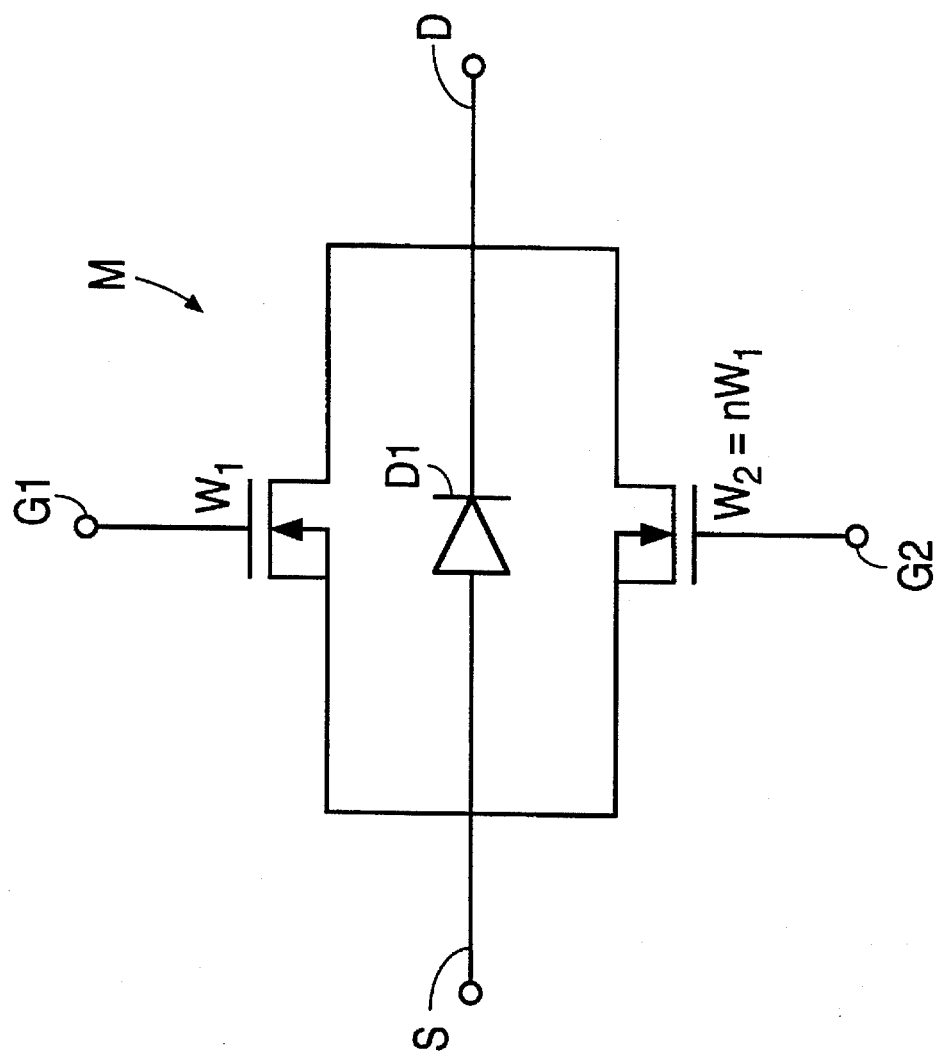
FIG. 4 is a schematic diagram of a dual-gated N-channel MOSFET in accordance with this invention.

A schematic diagram of such a MOSFET is shown in FIG. 4. N-channel MOSFET M includes a source S and a drain D, the source S being shorted to the body of the MOSFET to prevent the parasitic NPN bipolar transistor from tuning on. A diode D1 represents the "antiparallel" diode formed by the PN junction between the drain D and the body of MOSFET M. The state of MOSFET M is controlled by gates G1 and G2, which have widths equal to W1 and W2, respectively. W2 is equal to the factor N times W1.

Figure 5B:
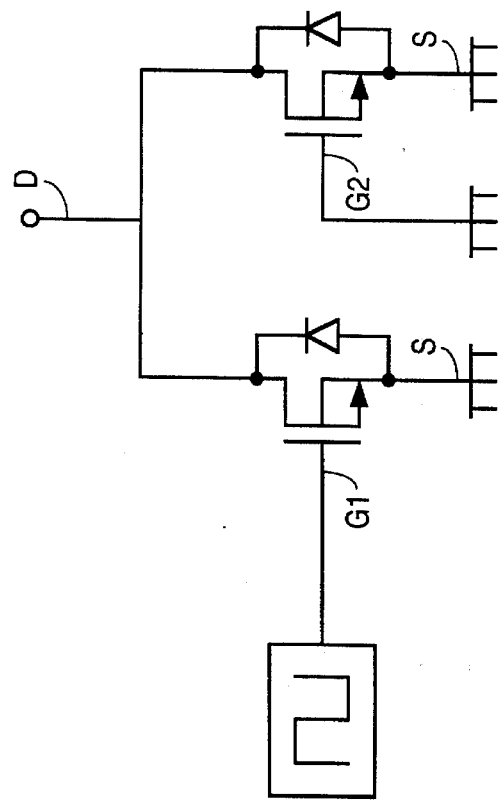
FIGS. 5A and 5B illustrate schematically the operation of the MOSFET of FIG. 4 in full power and light load conditions, respectively.
Figure 5A:
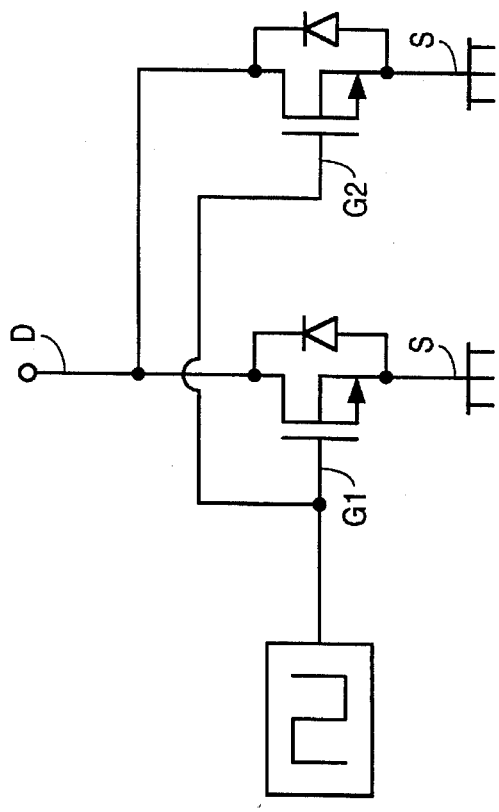

FIGS. 5A and 5B illustrate schematically the operation of MOSFET M in full power and light load conditions, respectively. As shown in FIG. 5A, during the full power or normal running mode, both of gates G1 and G2 are switched on and off by a pulse width modulation (PWM) signal. If the multiplier factor N is large, the channel controlled by the gate G2 will carry the major share of the current, and the on-resistance of MOSFET M will be relatively low. While gate G1 could be turned off in the full power mode, it is normally convenient to continue switching it as well.

As shown in FIG. 5B, when a light load condition is encountered, the PWM signal continues to switch gate G1 while gate G2 is grounded. Thus, during a light load condition, energy is not lost unnecessarily by driving the capacitance of the larger gate G2.

Figure 6:
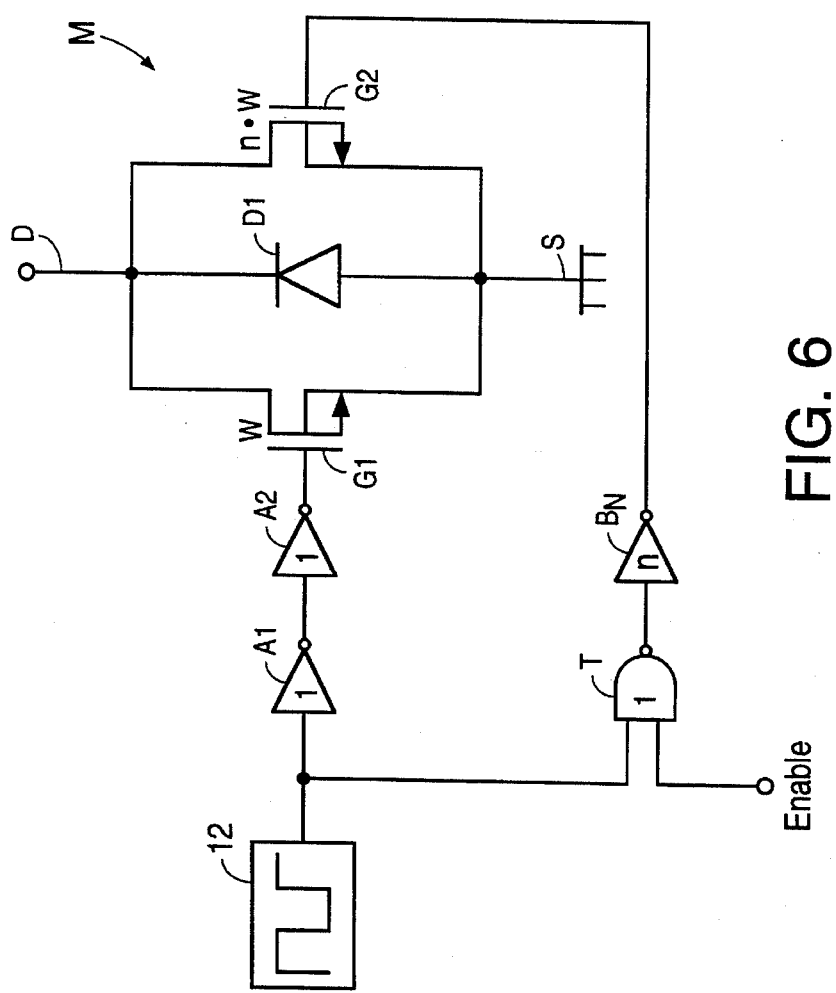
FIG. 6 is a circuit diagram of an arrangement for controlling the gates of the MOSFET shown in FIG. 4.
Figure 7:
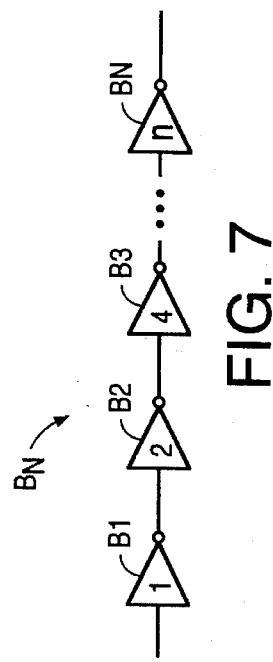
FIG. 7 is a circuit diagram of the inverter chain shown in FIG. 6.

An arrangement for controlling the gates G1 and G2 is shown in FIG. 6. The signal from PWM control 12 is split into two paths. The PWM signal to the smaller gate G1 passes through inverters A1 and A2, which are sized to handle the drive requirements of gate G1 at the frequency of PWM control 12 (e.g., 1 MHz). If necessary, inverter A2 can be stepped up in size as compared to inverter A1 so as to provide an appropriate current to gate G1. The signal path to gate G2 contains a similar but larger inverter chain $B_N$ which contains N inverters (see FIG. 7) to deliver a larger current to gate G2. The path to gate G2 also passes through a NAND gate T, the other input to NAND gate T being connected to a source of an enable signal. If the enable signal is brought high, gate G2 will be switched in unison with gate G1. If the enable signal is pulled low, gate G2 immediately stops switching. Thus gate G2 can be enabled or disabled instantaneously, and MOSFET M therefore responds without delay to a change from a full power to a light load condition, or vice versa.

Figure 8:
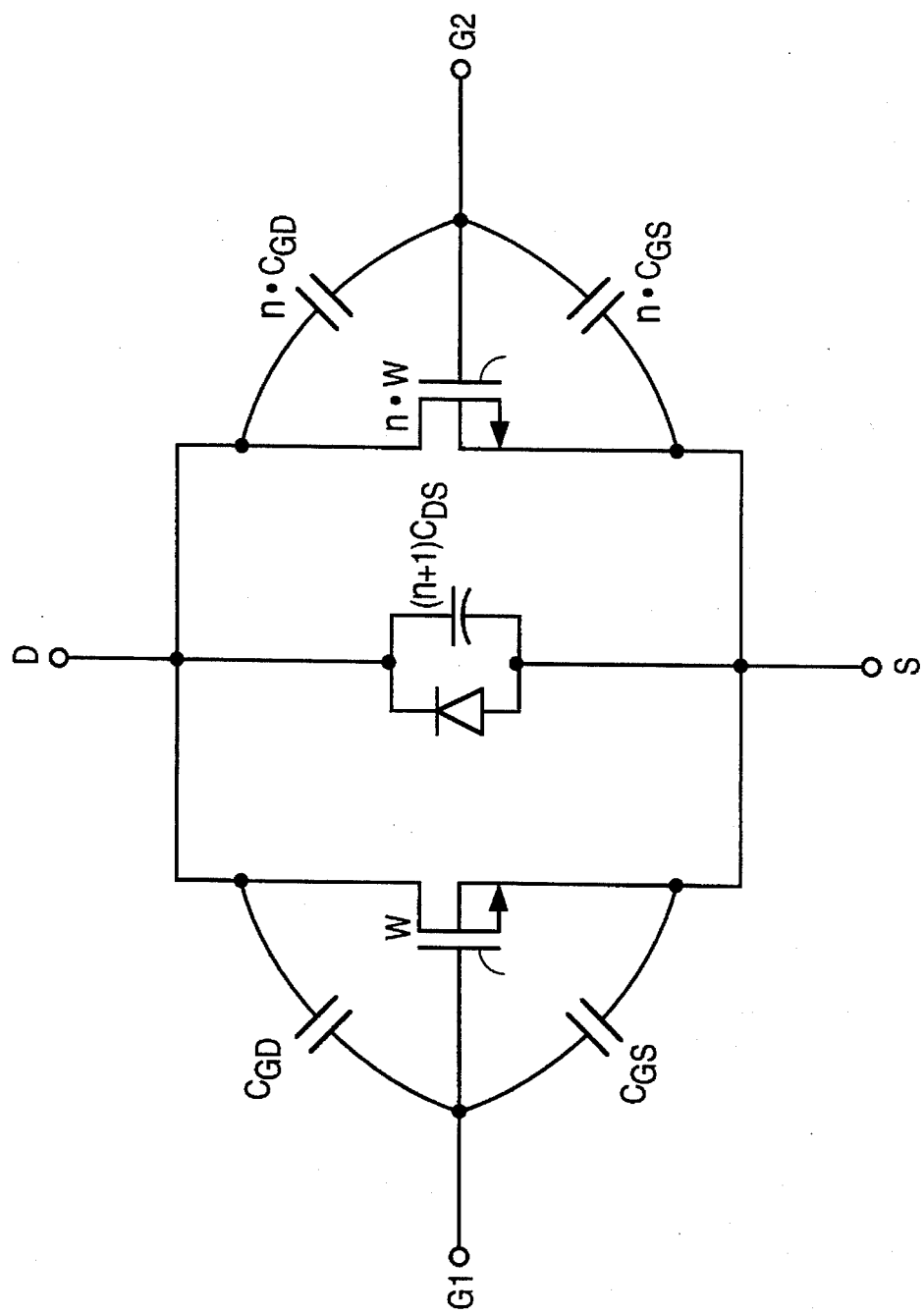
FIG. 8 illustrates schematically the capacitances present in the MOSFET of FIG. 4.

FIG. 8 illustrates schematically the capacitances present in MOSFET M. On the input side, there are capacitances $C_{GD}$ and $C_{GS}$ between gate G1 and drain D and between gate G1 and source S, respectively, and capacitances equal to N times $C_{GD}$ and N times $C_{GS}$ between gate G2 and drain D and gate G2 and source S, respectively. The total drain-to-source capacitance of MOSFET M is shown as (N+1) times $C_{DS}$, the drain-to-source capacitance associated with gate G1. It can be shown that the effective input capacitance and the drain current $I_D$ both are scaled down by a factor of 1/(N+1) when gate G2 is disabled during a light load condition, while the output capacitance remains the same. In other words, switching from both gates G1 and G2 to gate G1 alone is not equivalent to switching to a smaller MOSFET, since certain nodes and capacitances remain in the circuit at all times. Further information concerning the operation of MOSFETs in DC—DC converters may be found in Williams et al., "High-Frequency DC/DC Converter for Lithium-Ion Battery Applications Utilizes Ultra-Fast CBiC/D Process Technology", IEEE Advan. Power Elec. Conf. (APEC), May 1995, Dallas, Tex., pp. 322–332, and Williams et al., "Optimization of Complementary Power DMOSFETs for Low-Voltage High-Frequency DC—DC Conversion", id., pp. 765– 772, both of which are incorporated herein by reference in their entirety.

Figure 9:
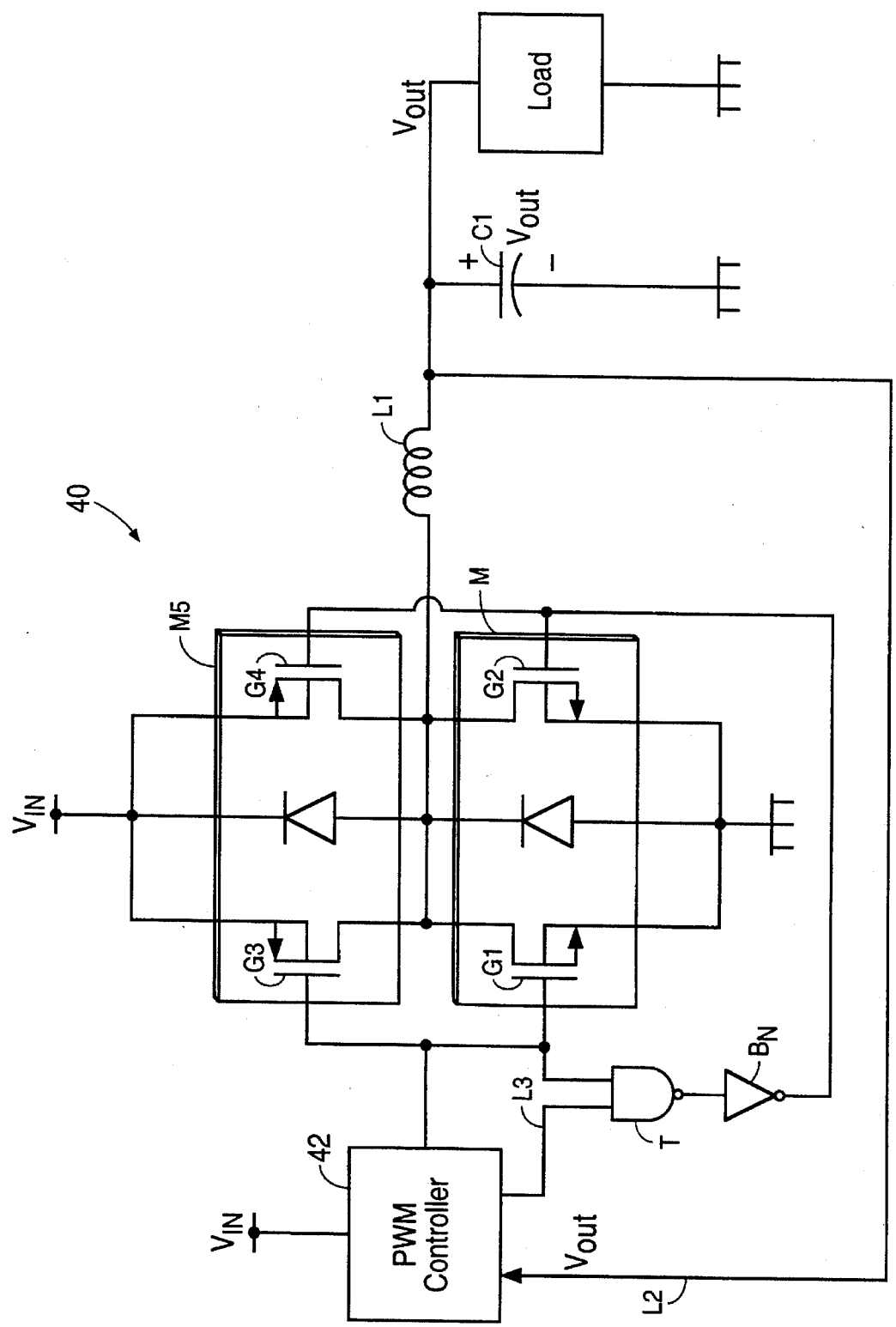
FIG. 9 is a circuit diagram of a complementary synchronous buck converter in which an N-channel dual-gated MOSFET is used as a synchronous rectifier or shunt switch and a dual-gated P-channel MOSFET is used as a series switch.

FIG. 9 is a circuit diagram of a complementary synchronous buck converter 40 which includes the dual-gated MOSFET M as an N-channel synchronous rectifier or shunt switch. A similar dual-gated P-channel MOSFET M5 is used as a series switch. MOSFET M5 includes a small gate G3 and a large gate G4. Gates G1 and G3 are supplied in parallel by a PWM controller 42, and the PWM signal from controller 42 is directed through NAND gate T and inverter $B_N$ to gates G2 and G4. The output of converter 40 is fed back to controller 42 through a feedback line L2. Controller 42 senses a light load condition in the load and delivers a high signal on a line L3, which is connected to an input of NAND gate T. In a full power condition of the load, a low signal appears on line L3, and the PWM signal is blocked from gates G2 and G4, thereby reducing the input capacitance that must be driven by controller 42.

Figure 10:
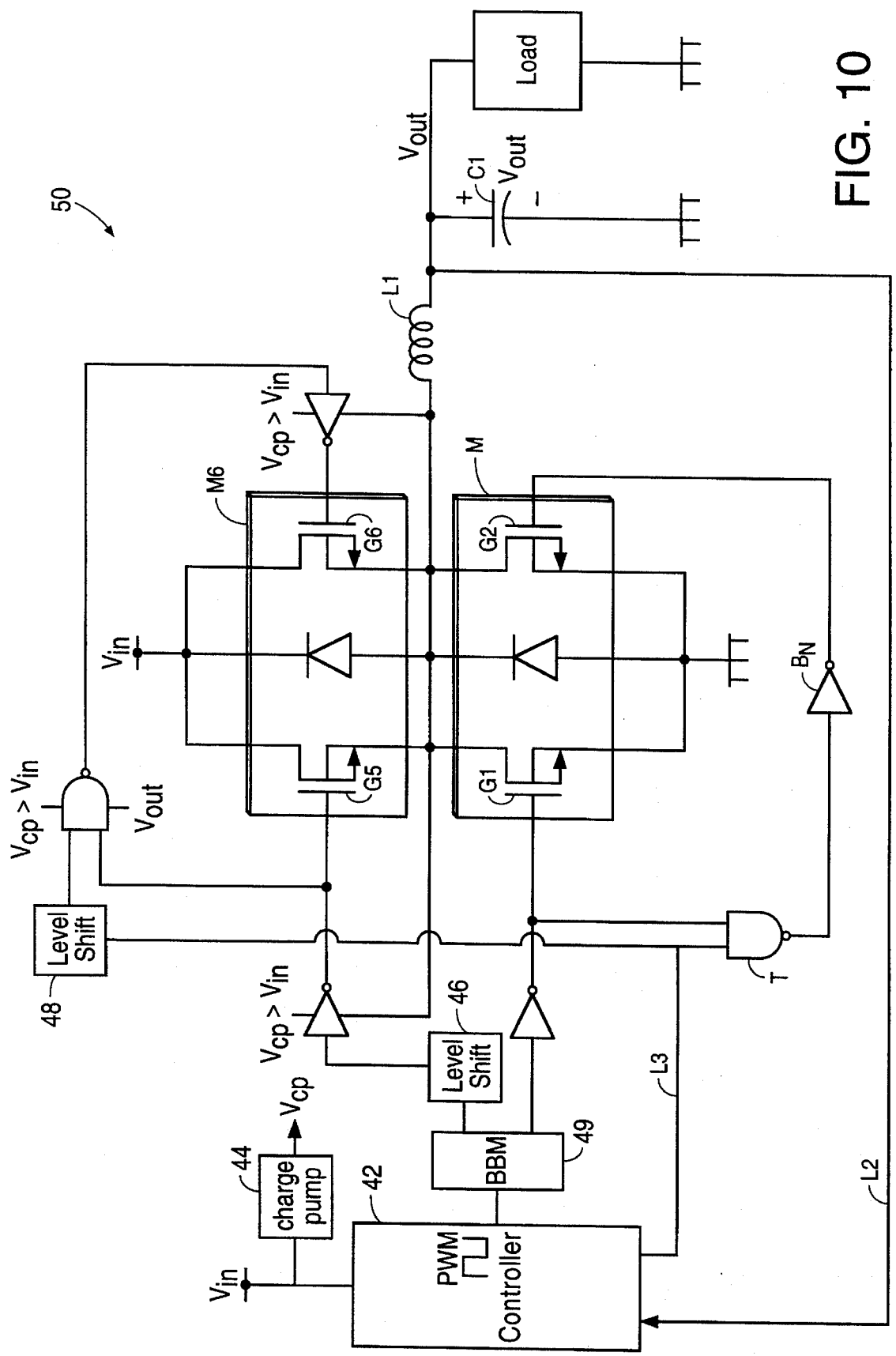
FIG. 10 is a circuit diagram of a buck converter in which an N-channel dual-gated MOSFET is used as a high side series switch.

FIG. 10 is a circuit diagram of a buck converter 50 which is similar to buck converter 40 except that an N-channel dual-gated MOSFET M6 is used as the high side series switch. MOSFET M6 has a small gate G5, which operates in unison with gate G1, and a large gate G6, which operates in unison with gate G2. Since the gate drive of N-channel MOSFET M6 must exceed $V_{in}$, a charge pump 44 is used to supply a voltage $V_{cp}$. Level shifters 46 and 48 are used to insure that the voltages delivered to gates G5 and G6 are referenced to the output voltage $V_{out}$ rather than ground. A make-before-break unit 49 insures that the gates of MOSFETs M and M6 are not driven high simultaneously (i.e., MOSFET M6 is turned off before MOSFET M is turned on, and vice versa), so as to prevent a shoot-through current from $V_{in}$ to ground.

FIGS. 11 through 18 illustrate several types of MOSFETs that can be constructed in accordance with this invention. It should be understood that the particular configurations shown in FIGS. 11 through 18 are illustrative only, and that numerous other embodiments may be constructed using the principles of this invention.

Figure 11:
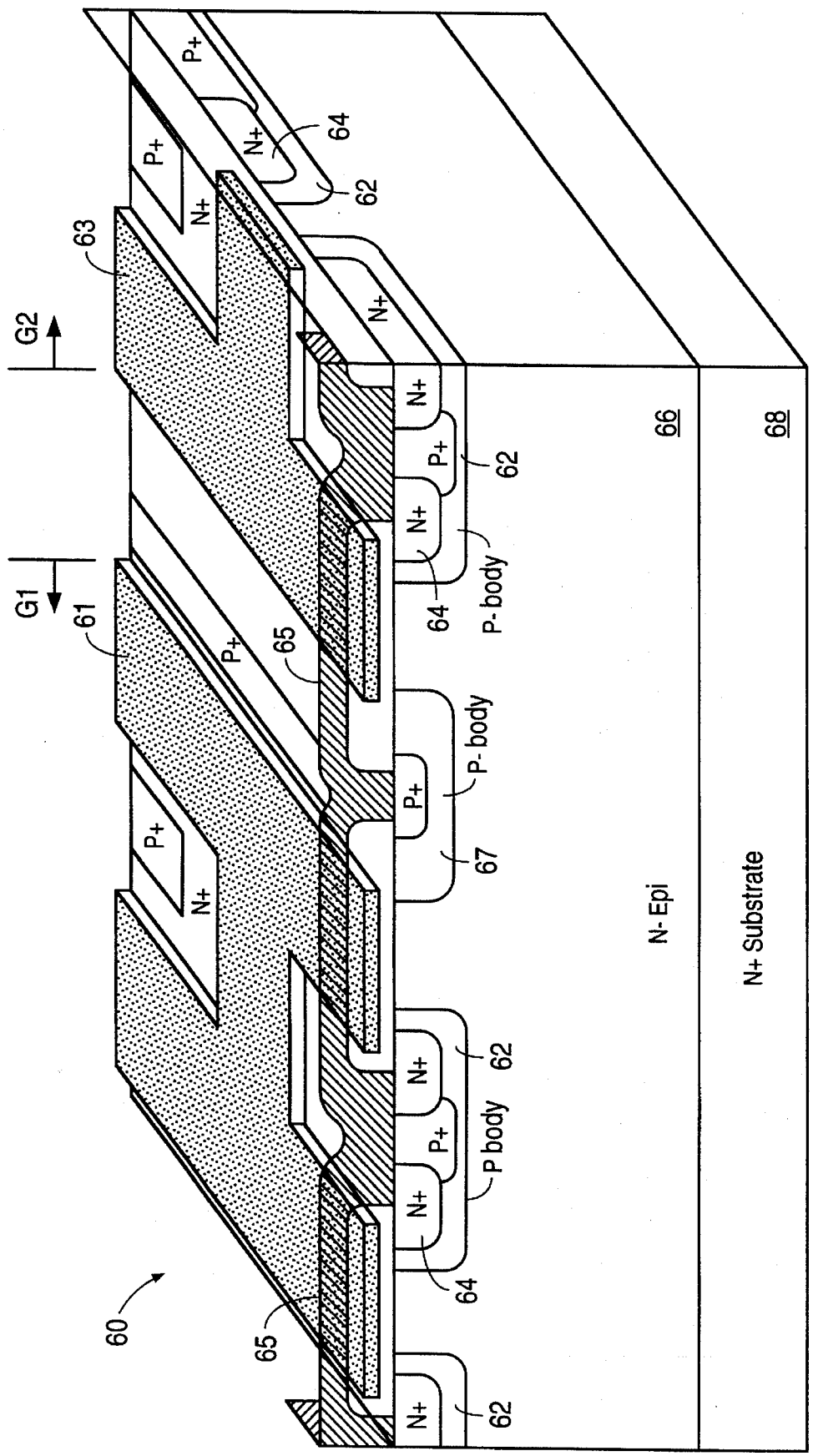
FIG. 11 is a three-dimensional cross-sectional view of a dual-gated vertical double-diffused MOSFET (DMOS).

FIG. 11 is a three-dimensional cross-sectional view of a vertical double-diffused MOSFET (DMOS) 60, which is formed in an N-epitaxial (epi) layer 66. Epi layer 66 is grown on an N+ substrate 68. MOSFET 60 includes individual cells arrayed on the surface of epi layer 66 in a polygonal pattern. Each cell includes a P-body diffusion 62 which encloses an N+ source region 64. N-epi layer 66 and N+ substrate 68 form the drain of MOSFET 60, and current flow takes place in channel regions at the surface of P-body diffusions 62. The N+ source regions 64 and the P-body diffusions 62 are shorted together by a metal layer 65.

The small gate (G1) of MOSFET 60 is represented as 61 and the large gate is represented as 63. Although not apparent from FIG. 11, gate 63 has a total width (approximated by the perimeters of the cells underlying gate 63) which is many times larger than the width of gate 61. Gates 61 and 63 are separated by a distinctive P-body diffusion 67 which does not contain a source region (and therefore carries no current) but is contacted by metal layer 65.

Figure 12:
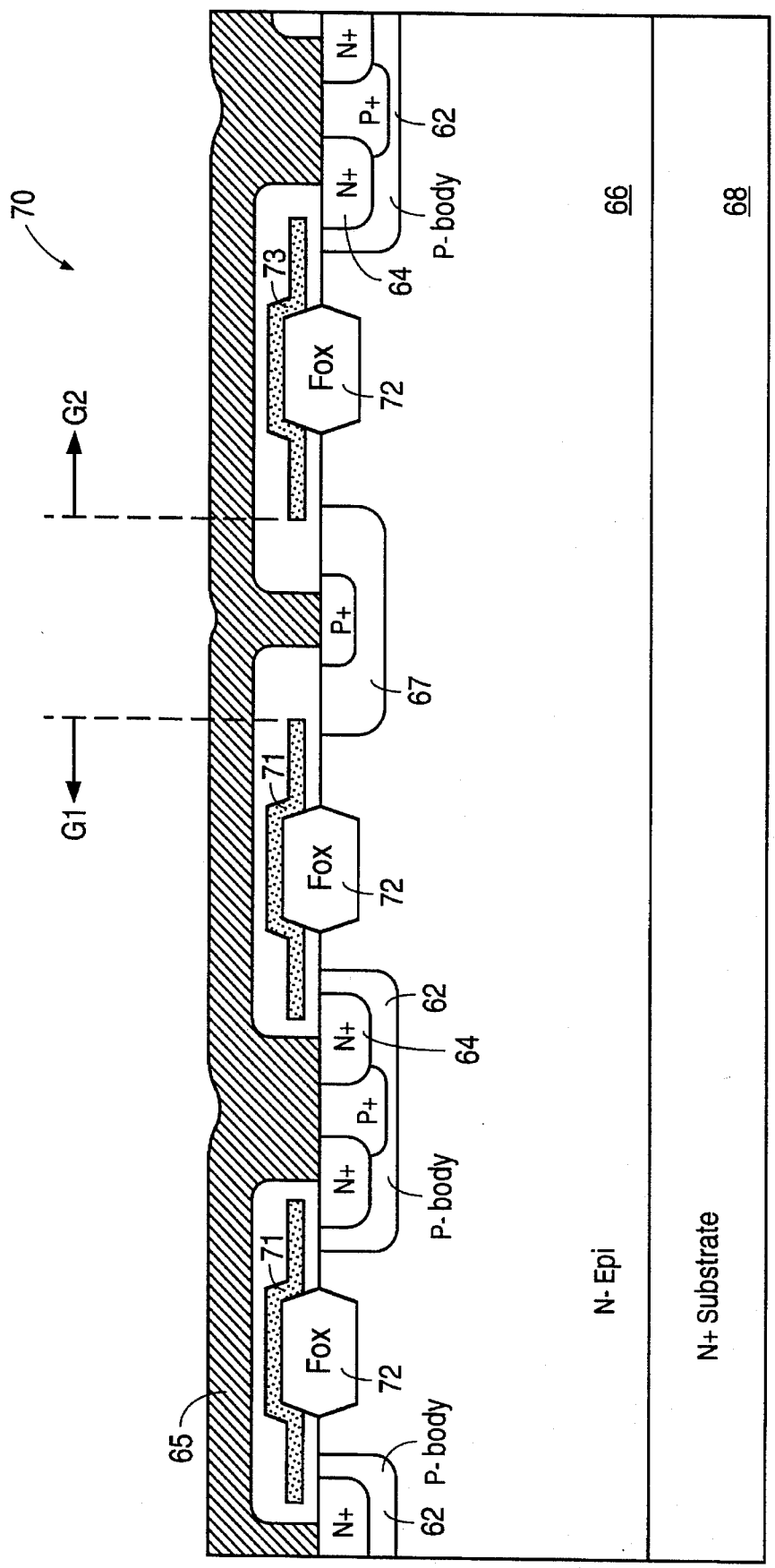
FIG. 12 is a cross-sectional view of a dual-gated vertical double-diffused MOSFET in which field oxide regions are interposed between adjacent P-body diffusions.

FIG. 12 is a cross-sectional view of a MOSFET 70 which is similar to MOSFET 60 but in which field oxide regions 72 are interposed between adjacent P-body diffusions 62, thereby altering the structure of small gate 71 and large gate 73. Field oxide regions 72 reduce the gate-to-drain overlap capacitance and reduce the charge on gates 71 and 73.

Figure 13:
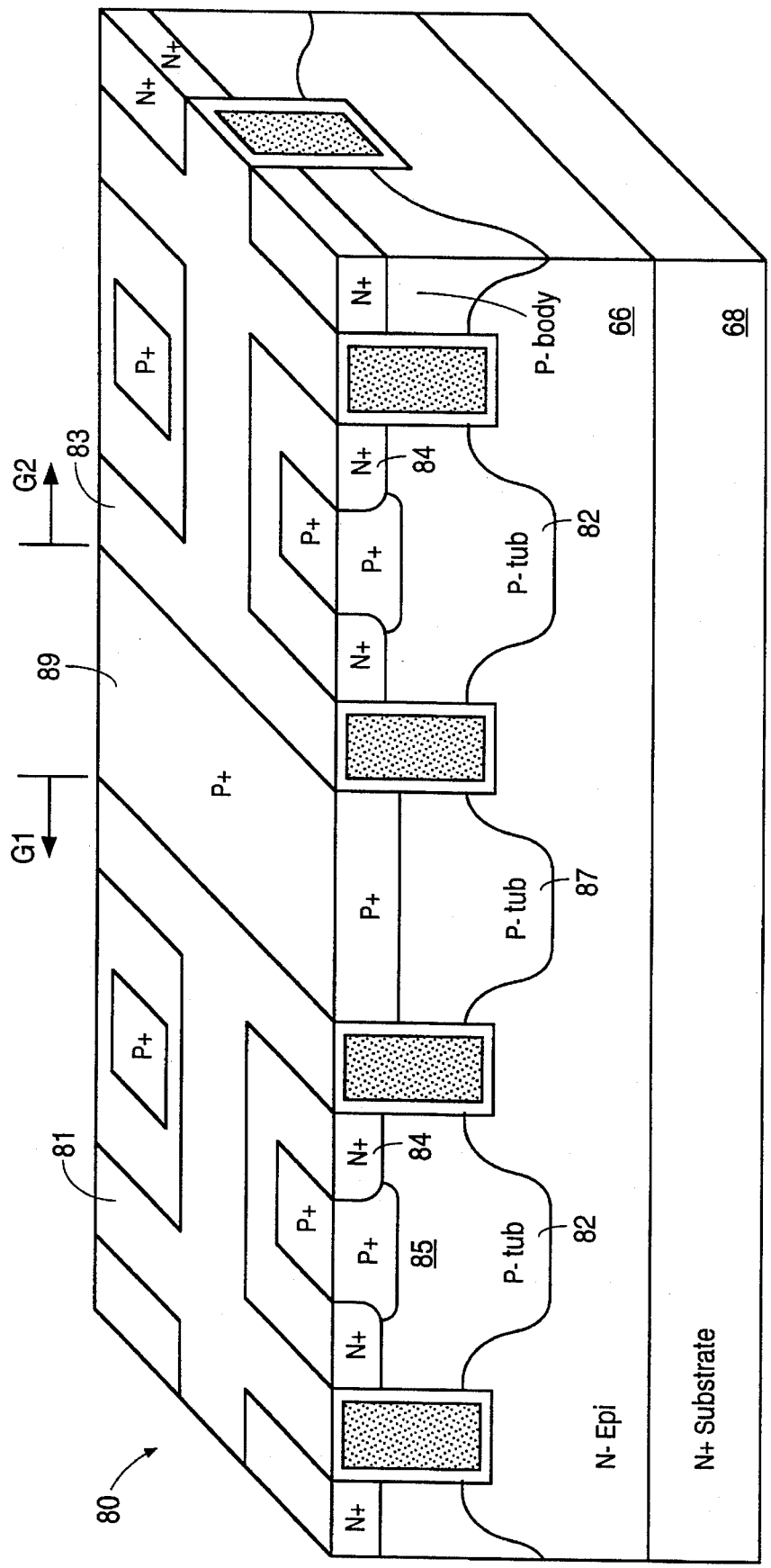
FIG. 13 is a three-dimensional cross-sectional view of double-diffused vertical MOSFET in which the small gate and the large gate are formed in a trench.

FIG. 13 is a three-dimensional cross-sectional view of double-diffused vertical MOSFET 80 in which the small gate 81 and the large gate 83 are formed in a trench. Each active cell of MOSFET 80 includes an N+ source region 84, a P-body diffusion 85 and a protective P-tub 82, which reduces the strength of the electric field at the corners of the trench and thereby prevents carrier generation and the resultant breakdown of the gate oxide layer. The N-epi layer 66 and N+ substrate 68 serve as the drain of the MOSFET. Current flows vertically through channel regions in the P-body diffusions adjacent the side walls of the trench.

Small gate 81 and large gate 83 are separated by a P-tub 87 which is similar to P-tubs 82 but does not abut a source region and therefore does not carry current. A surface P+ region 89 overlying P-tub 87 also separates gates 81 and 83.

Figure 14:
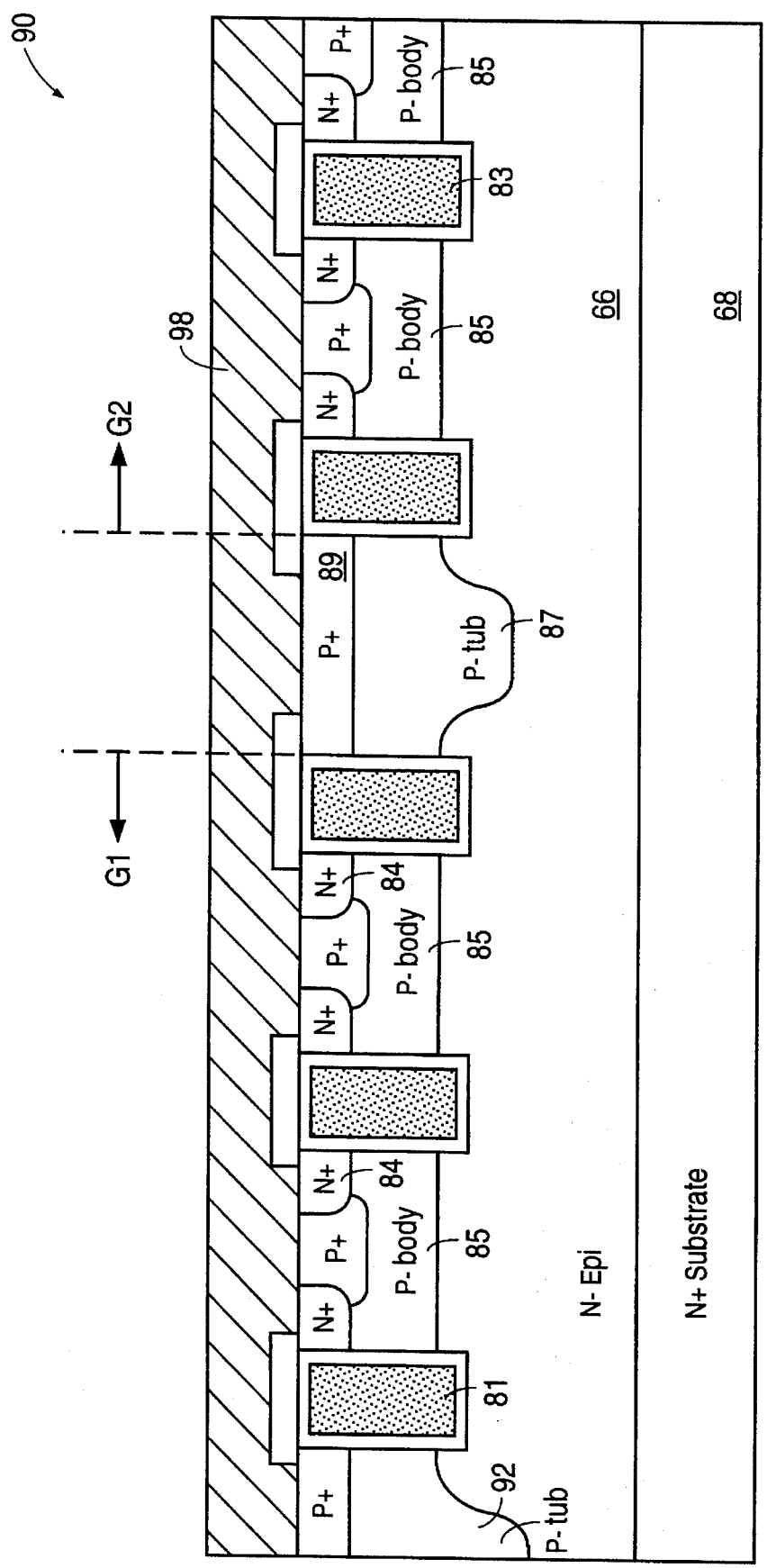
FIG. 14 is a cross-sectional view of a modified version of the MOSFET shown in FIG. 13.

FIG. 14 is a cross-sectional view of a modified version of MOSFET 80. In MOSFET 90, there is no protective P-tub in every cell. Instead, a protective P-tub 92 is formed in only a specified percentage of the active MOSFET cells as taught in application Ser. No. 08/460,336, filed Jun. 2, 1995, incorporated herein by reference in its entirety. This structure permits a greater cell density and reduces the on-resistance of the MOSFET. FIG. 14 also shows a metal layer 98 which shorts together P-tubs 87 and 92, P-body diffusions 85 and N+ source regions 84.

Figure 15:
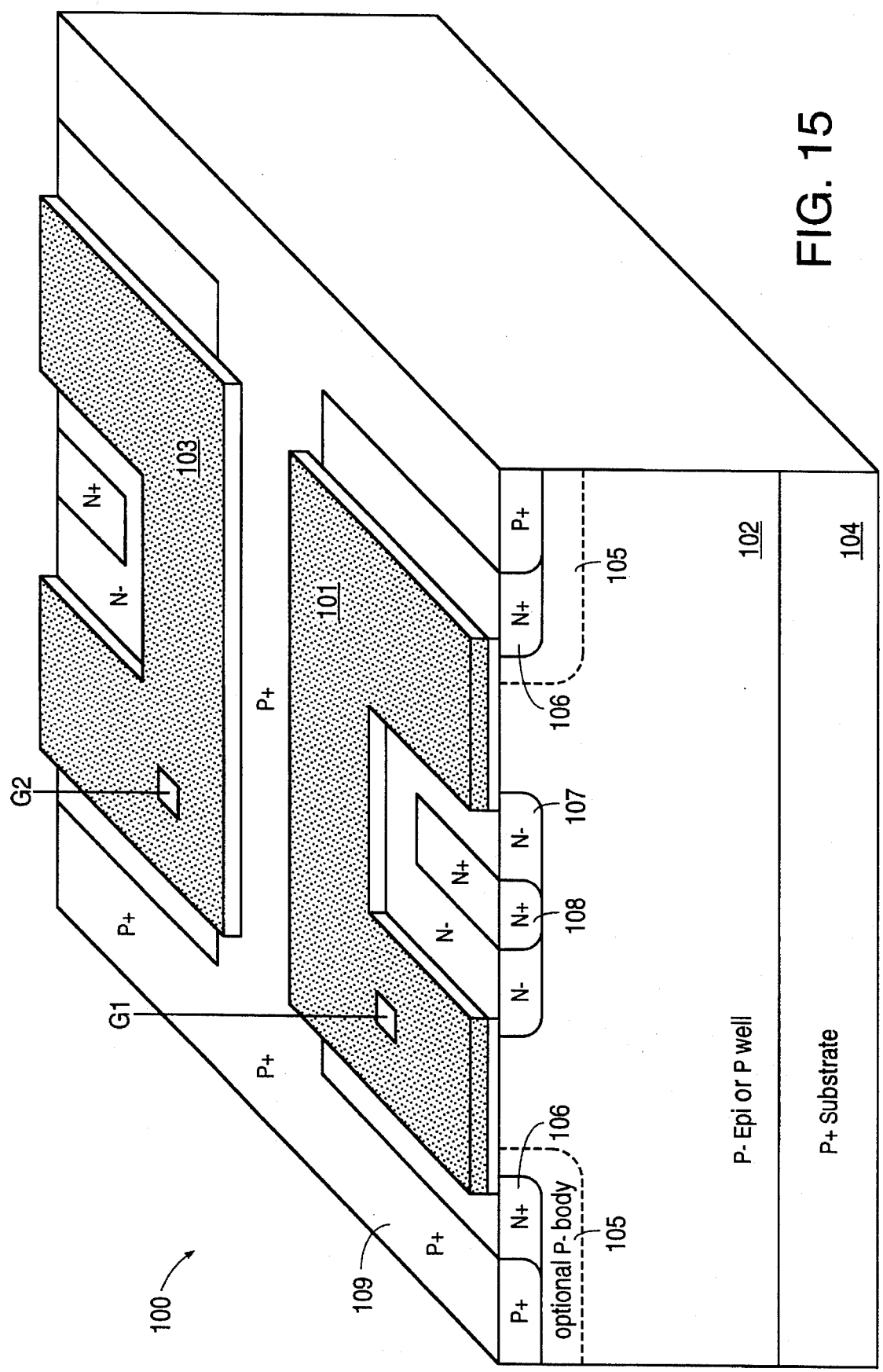
FIG. 15 is a three-dimensional cross-sectional view of a dual-gated lateral N-channel MOSFET formed in a stripe pattern.

FIG. 15 is a three-dimensional cross-sectional view of a lateral N-channel MOSFET 100 which is formed in a P-epi layer or P-well 102 overlying a P+ substrate 104. Current flows laterally near the surface of P-epi layer or P-well 102 in channel regions that are located between N+ source regions 106 and N+ drain regions 108. N-drift regions 107 which surround N+ drain regions 108 increase the ability of MOSFET 100 to block voltages. Optional P-body regions 105 may be formed around N+ source regions 106. A small gate 101 and a large gate 103 control current flow through the channel regions, gate 103 having a width many times the width of gate 101. Gates 101 and 103 are separated by an intervening P+ ring 109.

Figure 16:
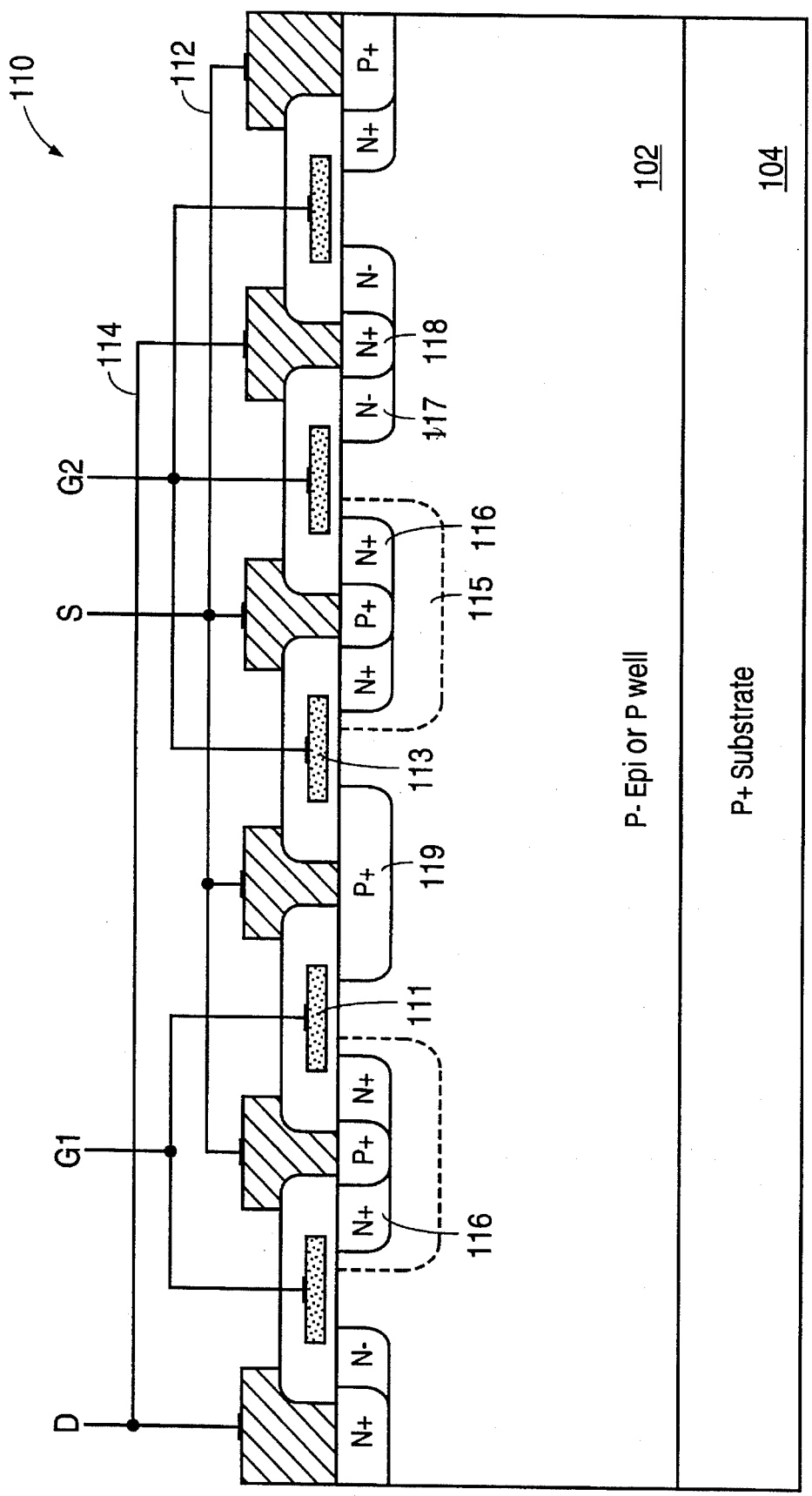
FIG. 16 is a cross-sectional view of a square-celled version of the MOSFET shown in FIG. 15.
Figure 17:
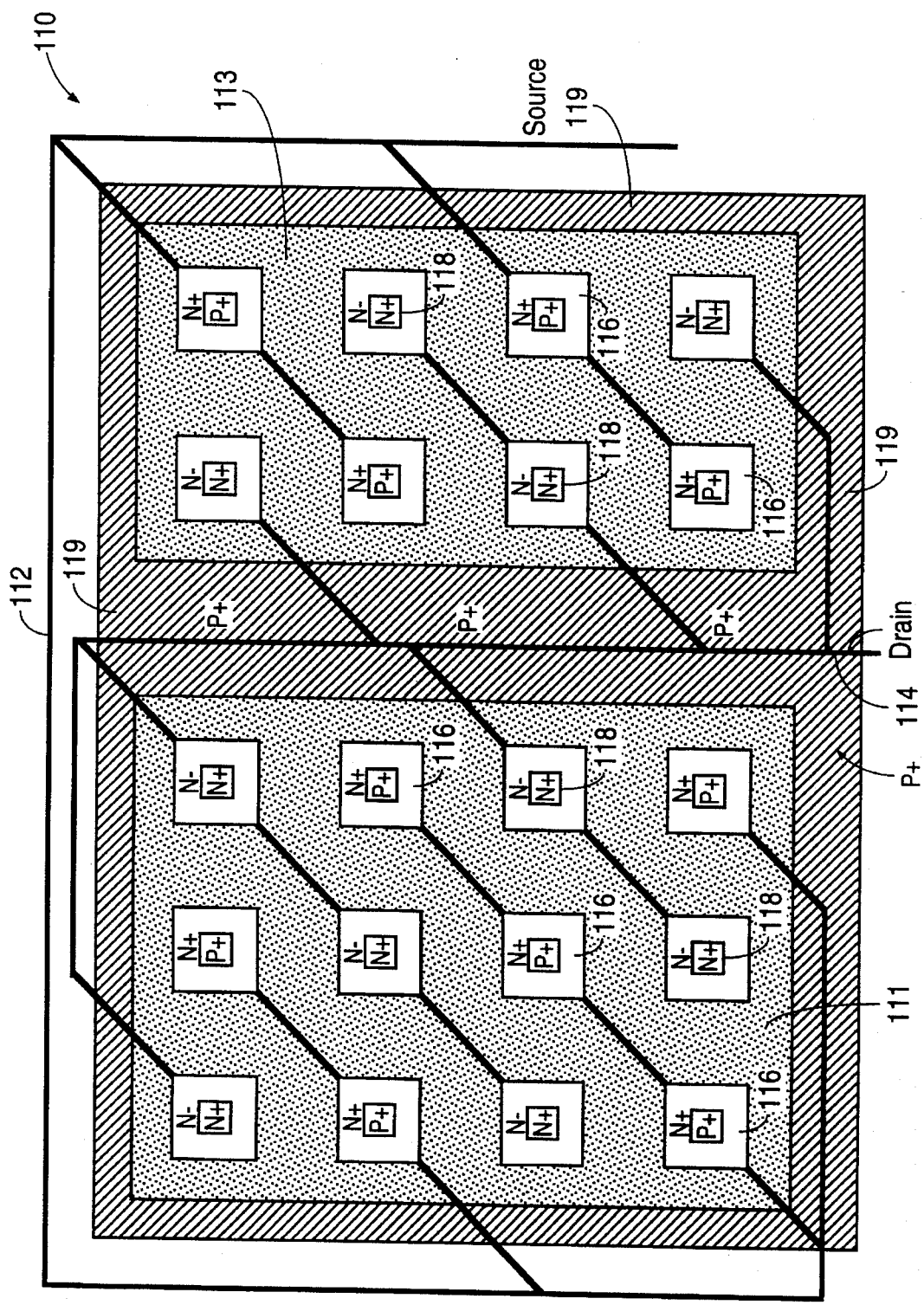
FIG. 17 is a plan view of the MOSFET shown in FIG. 16.

MOSFET 100 is formed in a stripe pattern on the surface of P-epi or P-well 102. FIG. 16 is a cross-sectional view of a MOSFET 110, which is a square-celled version of MOSFET 100. FIG. 16 shows schematically how gates 111 and 113, N+ source regions 116, N+ drain regions 118 and P+ rings 119 are interconnected by metal layers over the surface of the silicon. FIG. 17 is a plan view of MOSFET 110, showing the extent of gates 111 and 113 and how interdigitated source metal lines 112 and drain metal lines 114 extend diagonally across the surface of the MOSFET in the manner taught in U.S. Pat. No. 5,412,239, issued May 2, 1995. For purposes of clarity, the metal lines 112 and 114 are broken over the MOSFET cells themselves.

Figure 18:
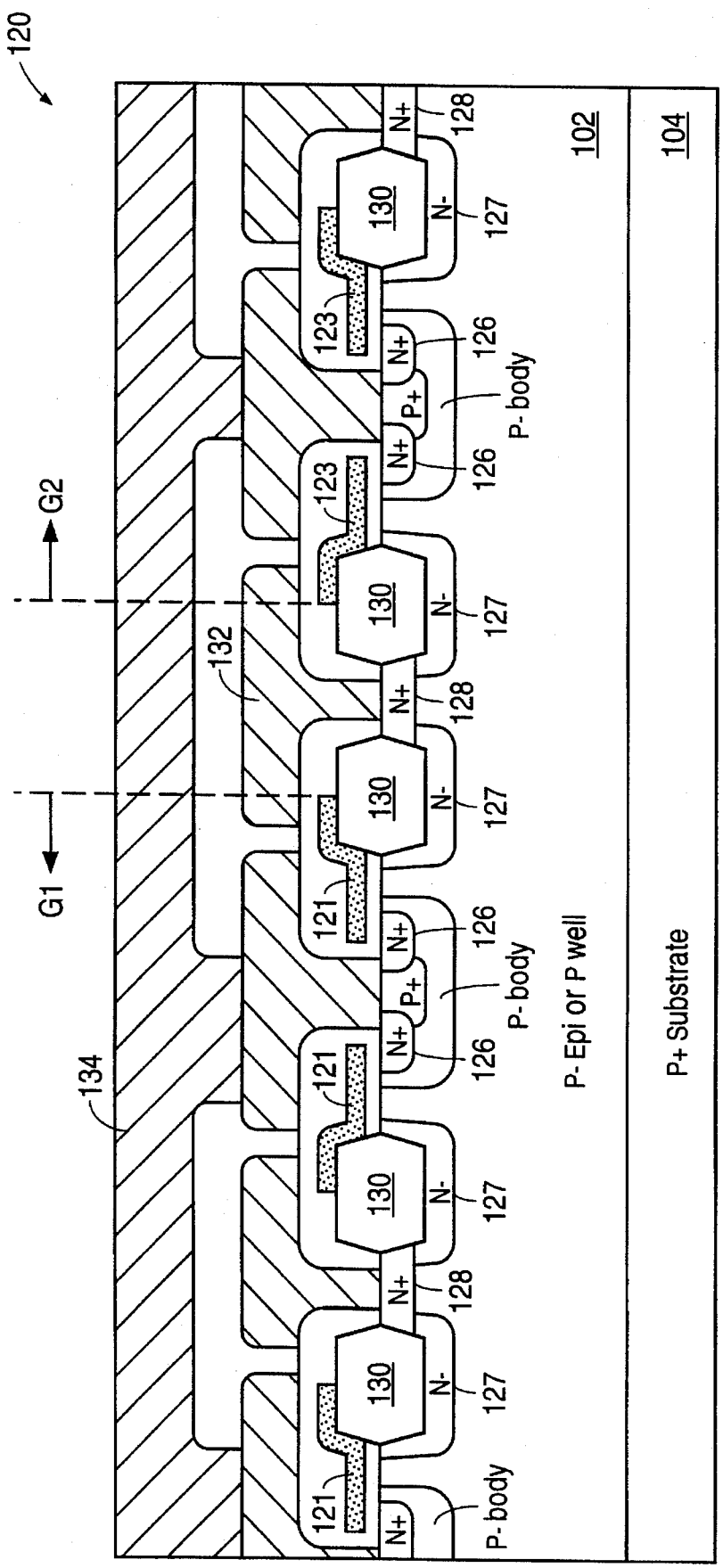
FIG. 18 is a cross-sectional view of a dual-gated lateral DMOSFET with field oxide regions overlying its drift regions.

FIG. 18 is a cross-sectional view of a lateral DMOSFET 120 which is formed with field oxide regions 130 overlying the N− drift regions 127. A small gate 121 and a large gate 123 overlap the field oxide regions 130. A drain metal layer 132 contacts N+ drain regions 128, and a source metal layer 134 contacts N+ source regions 126.

The specific embodiments of this invention described above are intended to be illustrative only, and are not intended to limit the broad scope of this invention, which is defined in the following claims.

I claim:

1. A multiple gated MOSFET comprising a source, a drain, a body, first and second gates, and a gate control, said first gate having a gate width that is different from a gate width of said second gate, said first gate being connected to an output terminal of said gate control, said second gate being connected to said output terminal through a switch, said first and second gates being electrically isolated from each other when said switch is open.

* * * * *

UNITED STATES PATENT AND TRADEMARK OFFICE
CERTIFICATE OF CORRECTION

PATENT NO. : 5,616,945
ISSUE DATE : April 1, 1997
INVENTOR(S) : Williams, Richard K.

It is certified that error appears in the above-identified patent and that said Letters Patent is hereby corrected as shown below:

Column 5, line 52, "light load" is changed to --full power--.

Column 5, line 54, "full power" is changed to --light load--.

Column 6, line 1, "make-before-break" is changed to --break-before-make--.

Signed and Sealed this

Second Day of May, 2000

*Attest:*

Q. TODD DICKINSON

*Attesting Officer*　　　　*Director of Patents and Trademarks*